United States Patent
Liang (10) Patent No.: US 12,099,309 B2
(45) Date of Patent: Sep. 24, 2024

(54) WAFER PROCESSING APPARATUS AND WAFER TRANSFER METHOD

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 448 days.

(21) Appl. No.: 17/599,705

(22) PCT Filed: Apr. 27, 2021

(86) PCT No.: PCT/CN2021/090097
§ 371 (c)(1),
(2) Date: Sep. 29, 2021

(87) PCT Pub. No.: WO2021/218942
PCT Pub. Date: Nov. 4, 2021

(65) Prior Publication Data
US 2023/0057774 A1     Feb. 23, 2023

(30) Foreign Application Priority Data

Apr. 29, 2020    (CN) .................. 202010356380.8

(51) Int. Cl.
*G05B 99/00*     (2006.01)
*G03F 7/00*      (2006.01)
(Continued)

(52) U.S. Cl.
CPC ........ *G03F 7/7075* (2013.01); *G03F 7/70525* (2013.01); *G03F 7/7085* (2013.01);
(Continued)

(58) Field of Classification Search
CPC ............................................. G05B 2219/2602
See application file for complete search history.

(56) References Cited

U.S. PATENT DOCUMENTS

2008/0186464 A1*  8/2008  Hirano .............. H01L 21/67276
                                                          355/72
2010/0148979 A1*  6/2010  Lee .................. H01L 21/68742
                                                          340/686.1
(Continued)

FOREIGN PATENT DOCUMENTS

CN        1301994 A  *   7/2001   ......... B32B 37/0007
CN      101192554 A       6/2008
(Continued)

OTHER PUBLICATIONS

International Search Report cited in PCT/CN2021/090097 mailed Jul. 14, 2021, 10 pages.

*Primary Examiner* — Suresh Suryawanshi
(74) *Attorney, Agent, or Firm* — Kilpatrick Townsend & Stockton LLP (57) ABSTRACT

The present disclosure relates to a wafer processing apparatus and a wafer transfer method. The wafer processing apparatus includes: a first machine; a second machine, including a manipulator, the manipulator transfers a wafer to the machine through a connection port; the connection port is provided between the first machine and the second machine; door panels, provided on the first machine and used to close the connection port; a detector, for detecting a current position of the door panel; a driver, connected to the door panel, for driving the door panel to move to open or close the connection port; and a controller, connected to the detector, the driver and the manipulator, for controlling the door panel to move according to the current position of the door panel to open or close the connection port, and control the manipulator to transfer the wafer.

15 Claims, 3 Drawing Sheets

(51) Int. Cl.
*H01L 21/67* (2006.01)
*G05B 19/418* (2006.01)
*H01L 21/677* (2006.01)

(52) U.S. Cl.
CPC .. *H01L 21/67126* (2013.01); *H01L 21/67242* (2013.01); *G05B 19/41815* (2013.01); *G05B 2219/2602* (2013.01); *G05B 2219/45031* (2013.01); *H01L 21/67703* (2013.01)

(56) References Cited

U.S. PATENT DOCUMENTS

| | | | |
|---|---|---|---|
| 2013/0243550 A1* | 9/2013 | Yasui | H01L 21/67745 414/217 |
| 2018/0195173 A1* | 7/2018 | Kato | C23C 16/45551 |
| 2018/0204753 A1* | 7/2018 | Kawai | H01L 21/67389 |

FOREIGN PATENT DOCUMENTS

| | | | |
|---|---|---|---|
| CN | 105405800 A | | 3/2016 |
| CN | 108447806 A | * | 8/2018 |
| CN | 208589424 U | | 3/2019 |
| KR | 20050047655 A | | 5/2005 |
| KR | 20060028994 A | | 4/2006 |
| KR | 102022804 B1 | * | 7/2018 |

* cited by examiner

WAFER PROCESSING APPARATUS AND WAFER TRANSFER METHOD

CROSS REFERENCE TO RELATED APPLICATION

The present disclosure claims the benefit and priority of Chinese Patent Application No. 202010356380.8, filed on Apr. 29, 2020 and entitled "WAFER PROCESSING APPARATUS AND WAFER TRANSFER METHOD", the disclosure of which is incorporated by reference herein in its entirety as part of the present disclosure.

TECHNICAL FIELD

The present disclosure relates to the field of semiconductor production and processing, in particular to a wafer processing apparatus and a wafer transfer method.

BACKGROUND

In the manufacture of semiconductor devices, the exposure machine and the TRACK machine are often used. The TRACK machine is a coating and developing machine, and the wafer is transferred from the TRACK machine to the exposure machine for exposure.

The sealing door between the exposure machine and the TRACK machine often fails to open in time when the TRACK machine carrying the wafer arrives at the exposure machine. As a result, the wafer production process is delayed, and the wafer production speed and productivity are reduced.

SUMMARY

An objective of the present disclosure is to provide a wafer processing apparatus and a wafer transfer method. The present disclosure can improve the wafer production speed and productivity.

In order to solve the above technical problem, the present disclosure provides a wafer processing apparatus. The wafer processing apparatus includes: a first machine; a second machine, including a manipulator, the manipulator transfers a wafer to the machine through a connection port; the connection port is provided between the first machine and the second machine; door panels, provided on the first machine and used to close the connection port; a detector, for detecting current position of the door panels; a driver, connected to the door panels, for driving the door panels to move to open or close the connection port; and a controller, connected to the detector, the driver and the manipulator, for controlling the door panels to move according to current position of the door panels detected by the detector so as to open or close the connection port, and control the manipulator to transfer the wafer.

The present disclosure further provides a wafer transfer method, the wafer transfer method is used for transferring a wafer between the first machine and the second machine of the wafer processing apparatus. The wafer transfer method includes: controlling the detector to detect the open-closed state of the connection port when the second machine is ready to transfer the wafer to the first machine through the connection port, and controlling the door panels to move to open the connection port when the connection port is closed.

BRIEF DESCRIPTION OF THE DRAWINGS

To describe the technical solutions in the embodiments of the present disclosure more clearly, the accompanying drawings required to describe the embodiments of the present disclosure are briefly described below. Apparently, the accompanying drawings described below are only some embodiments of the present disclosure. A person of ordinary skill in the art may further obtain other accompanying drawings based on these accompanying drawings without creative efforts.

DETAILED DESCRIPTION

The door panels separating the exposure machine and the TRACK machine is controlled by the exposure machine, and the manual control handle is located on the side of the exposure machine. The door panels often fails to open or close in time, which affects the normal operation of the exposure machine and the TRACK machine. This is an important reason for the low wafer production speed.

During the wafer transfer process, when it is detected that the door panels is not opened, the manager needs to enter the operation room where the TRACK machine and the exposure machine are located to manually open the door panels between the exposure machine and the TRACK machine. This requires a lot of time, and delays the wafer production process, thereby affecting the wafer production speed and productivity.

In addition, the TRACK machine sometimes needs to be restarted by software. When the TRACK machine is restarted by software, the airflow in the TRACK machine needs to be turned off. The door panels needs to be controlled in the closed position to close the connection port of the exposure machine, so as to prevent the air pressure change in the TRACK machine from causing the air pressure of the exposure machine to change to cause the stoppage of the exposure machine. Typically, the user is also required to enter the operation room where the TRACK machine and the exposure machine are located to manually open the door panels between the exposure machine and the TRACK machine, which affects the wafer production speed and productivity.

To make the objectives, technical means and effects of the present disclosure clearer, the present disclosure is described in further detail below with reference to the accompanying drawings. It should be understood that the embodiments described herein are merely a part rather than all of the embodiments of the present disclosure, and are not intended to limit the present disclosure. All other embodiments obtained by those of ordinary skill in the art based on the embodiments of the present disclosure without creative efforts should fall within the protection scope of the present disclosure.

The wafer processing apparatus and the wafer transfer method provided by the present disclosure are provided with a detector, a driver and a controller. The present disclosure can promptly and automatically move the door panels to open the connection port when the detector detects that the door panels are closed and the connection port is not opened. Therefore, the present disclosure can effectively prevent machine stoppage caused when the connection port is not opened, and does not require the user to manually move the door panels to open the connection port, thereby effectively improving the wafer production speed and productivity.

Figure 1:
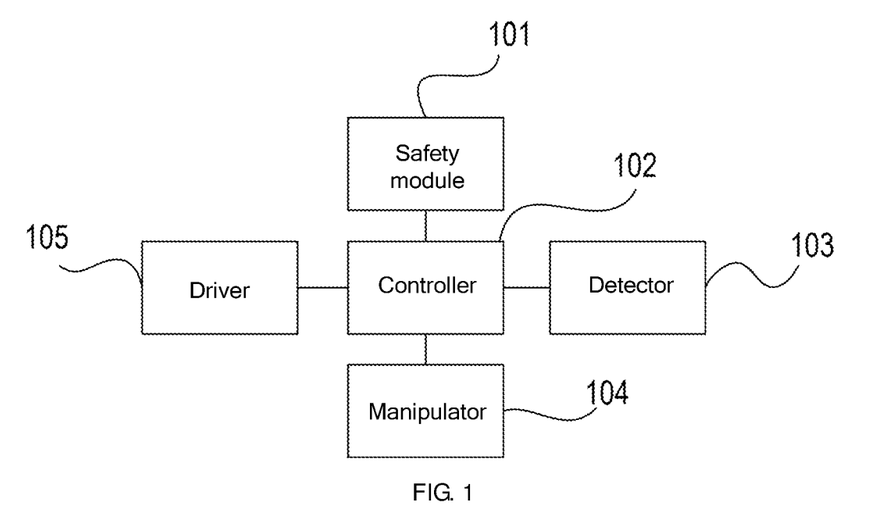
FIG. 1 is a schematic diagram of a connection relationship between various modules of a wafer processing apparatus according to an embodiment of the present disclosure.
Figure 2:
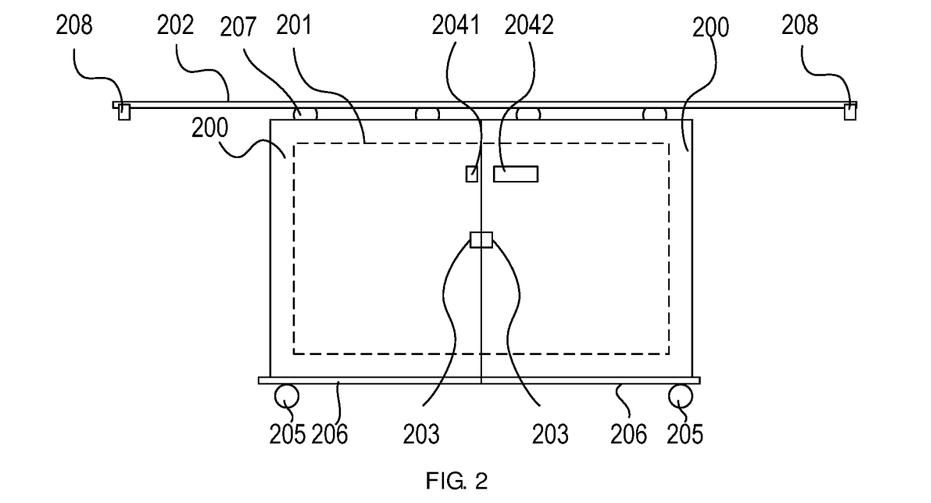
FIG. 2 is a schematic structural diagram of the wafer processing apparatus according to an embodiment of the present disclosure.
Figure 3:
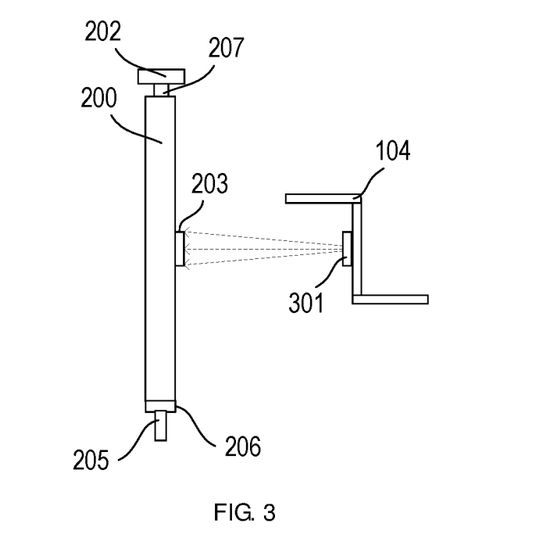
FIG. 3 is schematic a side view of the wafer processing apparatus according to an embodiment of the present disclosure.

Referring to FIGS. 1 to 3, FIG. 1 is a schematic diagram of a connection relationship between various modules of a wafer processing apparatus according to an embodiment of the present disclosure; FIG. 2 is a schematic structural diagram of the wafer processing apparatus according to an embodiment of the present disclosure; FIG. 3 is schematic a side view of the wafer processing apparatus according to an embodiment of the present disclosure.

An embodiment shown in FIGS. 1 to 3 provides a wafer processing apparatus. The wafer processing apparatus includes: a first machine; a second machine, including a manipulator 104, where the manipulator 104 transfers a wafer to the machine through a connection port 201; the connection port 201 is provided between the first machine and the second machine; door panels 200, provided on the first machine and used to close the connection port 201; a detector 103, for detecting a current position of the door panels 200; a driver 105, connected to the door panels 200, for driving the door panels 200 to move to open or close the connection port 201; and a controller 102, connected to the detector 103, the driver 105 and the manipulator 104, for controlling the door panels 200 to move according to the current position of the door panels 200 detected by the detector 103 so as to open or close the connection port 201, and control the manipulator 104 to transfer the wafer.

In this embodiment, the wafer processing apparatus is provided with a detector 103, a driver 105 and a controller 102. The wafer processing apparatus can promptly and automatically move the door panels 200 to open the connection port 201 when the detector 103 detects that the door panels 200 are closed and the connection port 201 is closed. Therefore, the wafer processing apparatus can effectively prevent machine stoppage caused when the connection port 201 is closed, and does not require the user to manually move the door panels 200 to open the connection port 201, thereby effectively improving the wafer production speed and productivity.

In an embodiment, the wafer processing apparatus further includes: a safety module 101, connected to the controller 102 and the manipulator 104, and the safety module 101 including a detection unit, for detecting an open-closed state of the connection port 201. When the detection unit of the safety module 101 detects that the connection port 201 is closed, the safety module 101 controls the manipulator 104 to stop transferring the wafer to the first machine.

In an embodiment, a signal processing circuit is further provided between the detection unit of the safety module 101 and the controller 102, which can amplify a signal sent by the detection unit, so as to facilitate the recognition of the signal by the controller 102.

In an embodiment, the first machine is an exposure machine, and the second machine is a TRACK machine. The safety module 101 is provided in the TRACK machine, for controlling the manipulator 104 of the TRACK machine to stop or continue to transfer the wafer into the exposure machine.

In an embodiment, the safety module 101 may not be provided, and the controller 102 may directly control the manipulator 104 to stop working.

In an embodiment, the detector 103 includes: a light source 301, connected to the controller 102 and facing a surface of the door panels 200, for projecting a detection light to the door panels 200 under the control of the controller 102; and photoresistor receivers 203, connected to the controller 102 and provided on a side surfaces of the door panels 200 facing the second machine, for detecting a light signal. The light source 301 is provided at a preset position, such that the light projected from the preset position is received by the photoresistor receiver 203 when the connection port 201 is closed. In other embodiments, the photoresistor receiver 203 does not receive the light only when the connection port is fully opened.

In an embodiment, the light source 301 starts to project the detection light to the door panels 200 when the detection unit of the safety module 101 detects that the connection port 201 is closed. When the detection unit does not detect that the connection port 201 is closed, the light source 301 does not respond to project the light.

In another embodiment, as long as the second machine starts to transfer the wafer to the first machine, the light source 301 starts to project the detection light to the door panels 200.

In this embodiment, the projection of the detection light by the light source 301 to the door panels 200 occurs periodically, so as to detect in time whether the door panels 200 is in the closed position to close the connection port 201. In this way, when the second machine transfers the wafer to the first machine, the door panels 200 is controlled to move in time to open the connection port 201, so as to avoid great production delays. However, in this case, the energy consumption is large.

When the door panels 200 is in the closed position and the connection port 201 is closed, the detection light is directly projected to the photoresistor receiver 203. The photoresistor receiver 203 outputs a corresponding electrical signal to the controller 102. The controller 102 controls the driver 105 to move the door panels 200 according to the control signal until the connection port 201 is opened.

In an embodiment, there are two door panels 200, which are respectively provided on two opposite sides of the connection port 201. The opening and closing of the connection port 201 is realized by moving the two door panels 200. There are two photoresistor receivers 203, which are provided on the side of the door panels 200 facing the second machine, and are respectively provided on the two door panels 200. The detector 103 further includes: a metal sheet 2041 and an inductive switch sensor 2042, which are respectively provided on surfaces of the same side of the two door panels 200. The inductive switch sensor 2042 is connected to the controller 102. The metal sheet 2041 and the inductive switch sensor 2042 are provided oppositely. When a distance between the metal sheet 2041 and the inductive switch sensor 2042 changes, an electrical parameter output by the inductive switch sensor 2042 changes accordingly.

In this embodiment, as long as one of the photoresistor receivers 203 receives a light signal, it is determined that the door panels 200 are in a closed position and the connection port 201 is in a closed state. In some embodiments, the connection port 201 is considered to be in a closed state only when the two photoresistor receivers 203 both receive a light signal. In this embodiment, it is determined that the connection port 201 is in a closed state when one of the photoresistor receivers 203 receives a light signal.

In some other embodiments, only one photoresistor receiver 203, or more than three photoresistor receivers 203 are provided on the two door panels 200. When a plurality of photoresistor receivers 203 are provided, misjudgment can be prevented when one of the photoresistor receivers 203 fails.

In an embodiment, the photoresistor receiver 203 includes a light sensor, which uses a photosensitive element to convert the light signal into an electrical signal. The sensitive wavelength of the light sensor is near the wavelength of visible light, including infrared wavelength and ultraviolet wavelength.

Referring to FIG. 3, in this embodiment, the light source 301 is provided on the manipulator 104 of the second machine. The photoresistor receiver 203 receives the detection light projected by the light source 301 and outputs a corresponding voltage signal. The controller 102 controls the driver 105 to move the door panels 200 according to the voltage signal.

In this embodiment, the metal sheet 2041 and the inductive switch sensor 2042 are used. When the distance between the metal sheet 2041 and the inductive switch sensor 2042 changes, the electrical parameter output by the inductive switch sensor 2042 to the controller 102 changes accordingly. The controller 102 performs corresponding control according to the change of the electrical parameter.

For example, when the distance between the metal sheet 2041 and the inductive switch sensor 2042 is very small, the inductive switch sensor 2042 outputs an electrical parameter corresponding to the distance. The controller 102 controls the driver 105 according to the electrical parameter to reduce the moving speed of the door panels 200, so as to prevent the door panels 200 from moving too fast to cause the door panels 200 and the driver 105 to be damaged when it is close to another door panels 200.

The metal sheet 2041 and the inductive switch sensor 2042 in this embodiment can also effectively prevent the driver 105 from still driving when the two door panels 200 are in the closed state, so as to prevent damage caused to the driver 105.

In an embodiment, when the distance between the metal sheet 2041 and the inductive switch sensor 2042 is 10 mm, the electrical parameter output by the inductive switch sensor 2042 is a preset electrical parameter to control the driver 105 to realize the decelerated movement of the door panels 200.

In an embodiment, the inductive switch sensor 2042 includes an oscillator, a switch circuit and an amplifying output circuit. The oscillator generates an alternating magnetic field. When a metal target approaches this magnetic field and reaches the sensing distance, an eddy current is generated in the metal target, which causes the metal oscillator to attenuate and even stop. The oscillation change and stop of the oscillator are processed by a later-stage amplification circuit and converted into a switch signal, which triggers the controller 102, so as to achieve the purpose of non-contact detection.

In an embodiment, the metal sheet 2041 includes at least one of iron sheet, copper sheet and chromium sheet.

In this embodiment, the switch signal is linearly related to the distance between the metal sheet 2041 and the inductive switch sensor 2042. Therefore, when the electrical parameter output by the inductive switch sensor 2042 is within the preset range, it can be considered that the distance between the two door panels 200 is small, and the moving speed of the door panels 200 needs to be slowed down.

In an embodiment, a signal conditioning circuit is further provided between the inductive switch sensor 2042 and the controller 102. In an embodiment, the inductive switch sensor 2042 is connected to the controller 102 via the signal conditioning circuit. The signal conditioning circuit amplifies, stabilizes and filters an analog signal output by the inductive switch sensor 2042, and performs analog-to-digital conversion, so as to convert the analog signal into a digital signal that can be recognized by the controller 102.

Figure 4:
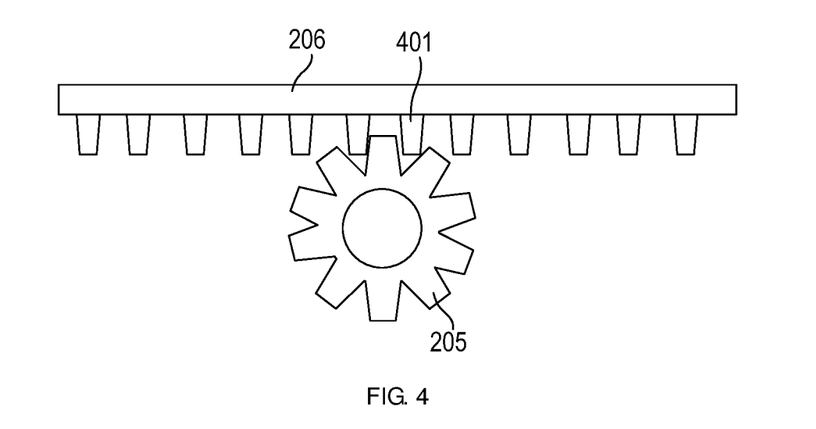
FIG. 4 is a partial enlarged view of the wafer processing apparatus according to an embodiment of the present disclosure.

In an embodiment, the driver 105 includes: a motor drive module, connected to the controller 102; a stepping motor, connected to the motor drive module and running under the control of the motor drive module; a driving gear 205, connected to the stepping motor, for rotating around a rotation axis of the driving gear 205 under the drive of the stepping motor, where the rotation axis is perpendicular to the surfaces of the door panels 200; and a gear bar 206, mounted in cooperation with the driving gear 205, and moving relative to a mounting position of the driving gear 205 when the driving gear 205 rotates. The door panel 200 is mounted directly above the gear bar 206 and moves under the drive of the gear bar 206. Referring to FIG. 4, a lower surface of the gear bar 206 is provided with teeth 401. The teeth 401 cooperate with the driving gear 205 such that the gear bar 206 drives the door panel 200 mounted on the gear bar 206 to move left and right when the driving gear 205 rotates.

In this embodiment, the deceleration of the driver 105 corresponds to a decrease in the speed of the stepping motor. When the door panels 200 are close to each other and the inductive switch sensor 2042 outputs a corresponding electrical parameter, the control voltage output by the motor drive module to the stepping motor also changes accordingly. In this way, the rotor speed of the stepping motor decreases, the speed of the driving gear 205 decreases, and the moving speed of the gear bar 206 also decreases.

In an embodiment, the stepping motor rotates at a certain angle under the control of the motor drive module. The driving gear 205 mounted on the stepping motor moves accordingly, and then drives the gear bar 206 to move left and right, so as to realize the movement of the door panels 200 and realize the opening and closing of the connection port 201. In an embodiment, the gear bar 206 is welded under the door panel 200, and the door panel 200 moves synchronously with the gear bar 206.

The stepping motor has a very high control accuracy, which helps to determine the rotation angle of the driving gear 205, so as to determine the position of the gear bar 206. When the stepping motor is controlled, the torque and speed of the stepping motor can be controlled by controlling the electrical signal input into the stepping motor. The rotor speed of the stepping motor is controlled by the input electric signal and the rotor can respond quickly.

In this embodiment, the stepping motor is positioned by pulses, and when the stepping motor receives a pulse, it rotates by an angle corresponding to the pulse, thereby realizing displacement. The stepping motor itself can send out pulses, and every time the stepping motor rotates an angle, it sends out a corresponding number of pulses. The pulse sent by the stepping motor and the pulse received correspond and form a closed loop. In this manner, the controller 102 can calculate the number of pulses sent to the stepping servo motor and the number of pulses sent from the stepping servo motor. Therefore, the controller can precisely control the rotation of the stepping motor, thereby realizing precise positioning, and the positioning accuracy can even reach 0.001 mm.

In an embodiment, the stepping motor can calculate the rotation angle according to a photoelectric encoder, and a storage circuit records the output pressure of a varistor and the rotation angle corresponding to the rotor of the stepping motor. The working principle of the photoelectric encoder is as follows. In operation, a light is projected on the encoder, and the encoder rotates with a moving object. The light transmitted through a bright area is received by photosensitive elements after passing through a slit. The arrangement of the photosensitive elements corresponds to code tracks one by one. The signal output by the photosensitive element in the bright area is 1 and the signal output by the photosensitive element in the dark area is 0. When the encoder rotates at different positions, the combination of the output signals of the photosensitive elements reflects a certain regular digital quantity, which represents the angular displacement of an encoder shaft.

In this embodiment, the controller 102 drives the stepping motor to rotate clockwise or counterclockwise through the motor drive module. In an embodiment, the motor drive module is implemented by a motor drive chip, and the motor drive chip is connected to the stepping motor. Through the motor drive chip, the stepping motor can receive the signal of the controller 102 to rotate accordingly, and the feedback signal detected inside the stepping motor can be transmitted to a microprocessor to form a closed loop control.

In an embodiment, the wafer processing apparatus further includes: a sliding rail 202, where a length direction of the sliding rail coincides with a moving path of the door panel 200; the sliding rail is mounted on the moving path of the door panel 200; the door panel 200 is mounted on the sliding rail 202 and is able to slide along the length direction of the sliding rail 202; turning wheels 207, fixedly mounted on the door panel 200, mounted in a groove of the sliding rail 202, and capable of rotating in the groove of the sliding rail 202 along the length direction of the sliding rail 202. The sliding rail 202 is provided directly above the door panel 200, the gear bar 206 is provided below the door panel 200, and the driving gear 205 is provided below the gear bar 206.

In this embodiment, the sliding rail 202 has a smooth inner wall. The turning wheel 207 is stuck in the groove of the sliding rail 202, and the friction between the turning wheel and the sliding rail 202 is very small. This can prevent the movement of the door panel 200 from being affected due to a great friction between the sliding rail 202 and the turning wheel 207 when the door panel 200 moves.

In this embodiment, each door panel 200 is provided with two turning wheels 207 to balance the force. In fact, the number of the turning wheels 207 on a single door panel 200 may be set as required. The turning wheel 207 is provided with a bolt and a bolt hole, by which the door panel 200 is fixed to the turning wheel 207. When the stepping motor drives the gear bar 206 below to move, the groove of the sliding rail and the turning wheel above support the weight of the sealing door and reduce the friction, such that the door panel 200 can move stably and efficiently.

Figure 5:
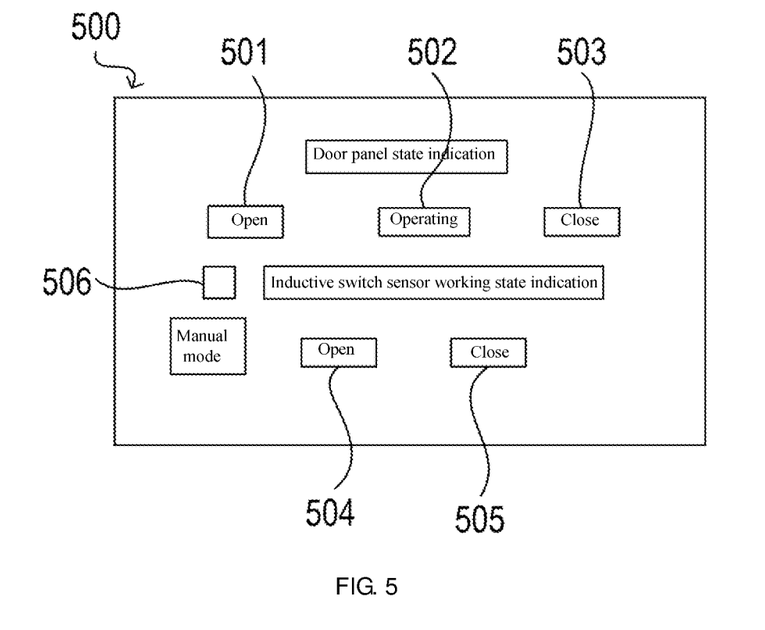
FIG. 5 is a schematic structural diagram of an interactive module according to an embodiment of the present disclosure.

In an embodiment, the wafer processing apparatus further includes an interactive module 500. The interactive module includes: a housing; a display unit, provided on an outer surface of the housing and connected to the controller 102, for displaying the open-closed state of the connection port; and buttons, provided in the housing, connected to the controller 102, and provided for a user to manually control the movement of the door panels 200 so as to control the opening and closing of the connection port 201.

In an embodiment, the closed state of the door panels 200 can be viewed in real time through the display unit. The display unit provides a friendly man-machine interface (MMI) for the user, and the user can view the current state of the door panels 200 intuitively. The buttons can also be used to manually open or close the door panels 200.

FIG. 5 is a schematic structural diagram of the interactive module according to an embodiment of the present disclosure. In this embodiment, the display unit includes an open state indicator light 501, an operating state indicator light 502, a closed state indicator light 503 and a working state indicator light 506 of an inductive switch sensor 2042, which are used to display the current state of the door panels 200 and the working state of the inductive switch sensor 2042 in real time.

In this embodiment, when the distance between the two door panels 200 is 0 cm, the connection port 201 is in a closed state, and the corresponding door panels 200 are in a closed state. At this time, the closed state indicator light 503 is on, the open state indicator light 501 is off, and working state indicator light 506 of the inductive switch sensor 2042 is on. When the distance between the left and right door panels 200 is greater than or equal to 40 cm, the door panels 200 are in an open state, the open state indicator light 501 is on, and the other indicator lights are off. At this time, the manipulator 104 can transfer the wafer into the connection port 201. In an embodiment, the controller 102 may calculate an arc length of rotation by the product of the rotation angle of the rotor of the stepping motor and the radius of the driving gear 205, which is the horizontal displacement of the door panels 200.

In an embodiment, the user can manually control the opening and closing of the door panels 200 through setting the buttons, which makes the operation of the wafer processing apparatus convenient. As shown in FIG. 5, the buttons include an open button 504 and a close button 505, which are respectively used to control the door panels 200 to open and to control the door panels 200 to close.

In another embodiment, the buttons include an open button 504, a close button 505 and a pause button. When the open button 504 is pressed, the controller 102 controls the stepping motor to rotate forward and drives the two door panels 200 to move in directions away from each other. When the close button 505 is pressed, the controller 102 controls the stepping motor to rotate backward and drives the two door panels 200 to move toward each other, so as to close the connection port 201. When the pause button is pressed, the controller 102 controls the stepping motor to stop rotating, and the door panels 200 no longer moves.

In an embodiment, in addition to these corresponding indicator lights, the display unit may further include a touch screen. The touch screen may also be directly used to display whether the door panels 200 is in a closed state.

In this embodiment, the touch screen is connected to a decoder chip through a touch screen interface circuit, and the decoder chip is connected to the controller 102. In an embodiment, the type of the decoder chip is ADS7843. The controller 102 drives the decoder chip to enable the touch screen to display corresponding information. The decoder chip can convert an input signal sensed by the touch screen into an output signal, and send it to the controller 102, and the controller 102 drives a corresponding execution device to realize a corresponding function.

In an embodiment, the controller 102 includes at least one of a programmable logic device, a microcontroller 102 and a single-chip microcomputer.

In an embodiment, the wafer processing apparatus further includes stoppers respectively provided at both ends of the sliding rail 202 to limit the two door panels 200, so as to prevent the two door panels 200 from sliding out of the sliding rail 202 when they move in directions away from each other.

In this embodiment, the stoppers include stop blocks 208 respectively provided at both ends of the sliding rail 202. In an embodiment, a sensing unit is provided on a side of the stopper facing the door panels 200. The sensing unit is connected to the controller 102. When the sensing unit detects that the door panels 200 touches the stop block 208, a control instruction is sent to inform the controller 102 to stop the driving of the door panels 200 by the driver 105.

Figure 6:
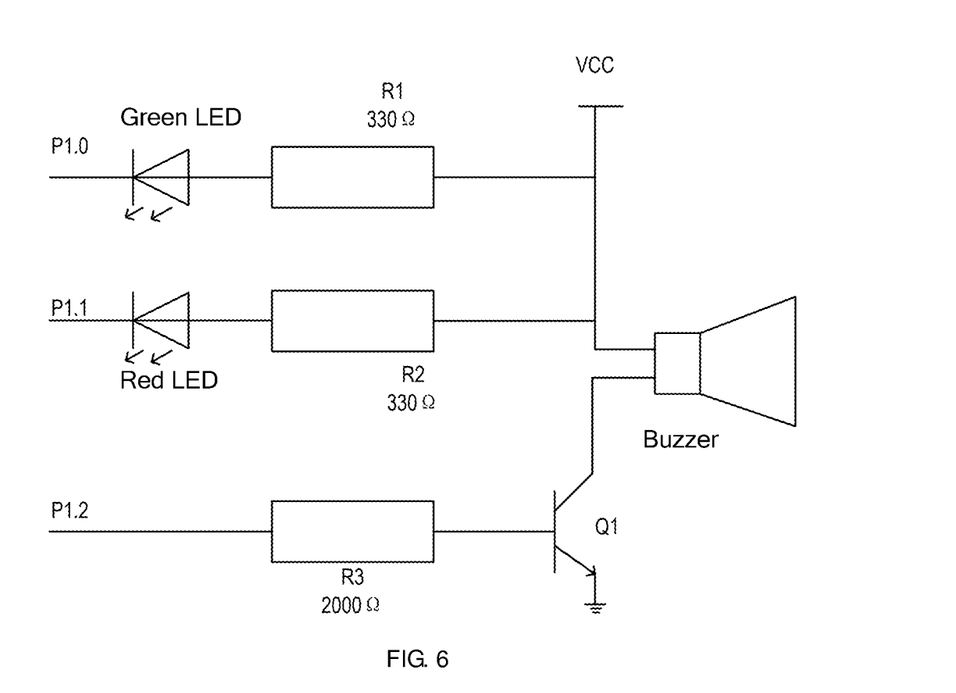
FIG. 6 is a schematic circuit diagram of an alarm according to an embodiment of the present disclosure.

In an embodiment, the wafer processing apparatus further includes an alarm, connected to the controller 102, and including at least one of a buzzer and a light-emitting diode (LED) lamp. The alarm can promptly and effectively notify the user of the current open-closed state of the connection port 201.

FIG. 6 is a schematic circuit diagram of the alarm according to an embodiment of the present disclosure. There are three interfaces in the figure, P1.0, P1.1 and P1.2, which serve as connection interfaces between the controller 102 and the alarm. When the controller 102 detects a normal value, the controller 102 provides a low level to the P1.0 interface, such that a green LED connected to the P1.0 interface lights up. The controller 102 also provides a low level to the P1.2 interface, such that a transistor Q1 shown in the figure is turned off and the buzzer does not work. When the controller 102 detects an abnormal value, the controller 102 provides a low level to the P1.1 interface, such that a red LED indicator lights up. The controller 102 also provides a high level to the P1.2 interface, such that the transistor Q1 connected to the buzzer is turned on and the buzzer works.

In an embodiment, the controller 102 controls the alarm to issue an alarm after the connection port 201 is kept closed for a period of time.

In an embodiment, the wafer processing apparatus further includes a timer connected to the controller 102 and used to count a duration when the connection port 201 is continuously in a closed state.

In this embodiment, the timer starts timing from zero when the inductive switch sensor 2042 outputs a preset electrical parameter. If the duration of the inductive switch sensor 2042 outputting the preset electrical parameter exceeds a preset duration, such as 3 hours, the controller 102 drives the alarm to issue an alarm to remind the staff. When the staff confirms that there is no abnormality, a reset button is pressed to restore the timer to the initial zero state so as to restart timing.

This embodiment further provides a wafer transfer method, which is used for transferring a wafer between the first machine and the second machine of the wafer processing apparatus. The wafer transfer method includes: control the detector 103 to detect the open-closed state of the connection port 201 when the second machine is ready to transfer the wafer to the first machine through the connection port 201, and control the door panels 200 to move to open the connection port 201 when the connection port 201 is closed.

In this embodiment, the wafer transfer method is provided with a detector 103, a driver 105 and a controller 102. The wafer transfer method can promptly and automatically move the door panels 200 to open the connection port 201 when the detector 103 detects that the door panels 200 are closed and the connection port 201 is not opened. Therefore, the wafer transfer method can effectively prevent machine stoppage caused when the connection port 201 is not opened, and does not require the user to manually move the door panels 200 to open the connection port 201, thereby effectively improving the wafer production speed and productivity.

In an embodiment, there are two door panels 200, which are respectively provided on two opposite sides of the connection port 201. The opening and closing of the connection port 201 is realized by moving the two door panels 200. When the door panels 200 are controlled to move to open the connection port 201, the wafer transfer method further includes: control the detector 103 to detect the distance between the two door panels 200, and when the distance between the two door panels 200 is within a preset range, control the driver 105 to reduce a moving speed of the door panels 200.

In an embodiment, the detector 103 includes: a light source 301, connected to the controller 102 and facing surfaces of the door panels 200, for projecting a detection light to the door panels 200 under the control of the controller 102; and two photoresistor receivers 203, connected to the controller 102, provided on the side of the door panels 200 facing the second machine, and respectively provided on the two door panels 200, for detecting a light signal. When the light projected by the light source 301 is received by one or more photoresistor receiver 203, the detector 103 sends a signal corresponding to the closing of the connection port 201 to the controller 102.

In an embodiment, the wafer processing apparatus further includes: a safety module 101, including a detection unit and connected to the controller 102 and the manipulator 104, for detecting, by the detection unit, an open-closed state of the connection port 201, and controlling the manipulator 104 to stop transferring the wafer to the first machine when the detection unit detects that the connection port 201 is closed. When the detection unit detects that the connection port 201 is closed, the controller 102 controls the light source 301 to project the detection light to the door panels 200.

In an embodiment, the detector 103 further includes: a metal sheet 2041 and an inductive switch sensor 2042, which are respectively provided on surfaces of the same side of the two door panels 200. A distance between the metal sheet 2041 and the inductive switch sensor 2042 changes, and an electrical parameter output by the inductive switch sensor 2042 changes. When the detector 103 is controlled to detect the open-closed state of the connection port 201, the wafer transfer method further includes: reduce a driving speed of the driver 105 when the electrical parameter output by the inductive switch sensor 2042 is within a preset range.

In an embodiment, the wafer processing apparatus further includes a timer connected to the controller 102 and used to count a duration when the connection port 201 is continuously in a closed state. The wafer transfer method further includes: control the timer to start timing from zero when the electrical parameter output by the inductive switch sensor 2042 is within a preset range, and issue an alarm when the duration counted by the timer is greater than a preset value.

The above described are merely preferred implementations of the present disclosure. It should be noted that several improvements and replacements may further be made by those of ordinary skill in the art without departing from the principle of the present disclosure, but such improvements and replacements should also be deemed as falling within the protection scope of the present disclosure.

The invention claimed is:

1. A wafer processing apparatus, comprising:
a first machine;
a second machine, comprising a manipulator, the manipulator transfers a wafer to the first machine through a connection port; the connection port is provided between the first machine and the second machine;
two door panels, provided on the first machine and used to close the connection port, two door panels are respectively provided on two opposite sides of the connection port, and the opening and closing of the connection port is realized by movement of the two door panels;
a detector, for detecting current position of the door panels, wherein the detector further comprises a metal sheet and an inductive switch sensor, the metal sheet and the inductive switch sensor are respectively provided on surfaces of the same side of the two door panels, the metal sheet and the inductive switch sensor are provided oppositely, when a distance between the metal sheet and the inductive switch sensor changes, an electrical parameter output by the inductive switch sensor changes accordingly;
a driver, connected to the door panels, for driving the door panels to move to open or close the connection port; and
a controller, connected to the detector, the driver and the manipulator, for controlling the door panels to move according to current position of the door panels detected by the detector so as to open or close the connection port, and control the manipulator to transfer the wafer, wherein the inductive switch sensor is connected to the controller and the controller is configured to reduce a driving speed of the driver when the electrical parameter output by the inductive switch sensor is within the preset range.

2. The wafer processing apparatus according to claim 1, the wafer processing apparatus further comprises:
a safety module, connected to the controller and the manipulator, and comprising a detection unit, for detecting an open-closed state of the connection port, when the detection unit detects that the connection port is closed, the safety module controls the manipulator to stop transferring the wafer to the first machine.

3. The wafer processing apparatus according to claim 1, wherein the detector comprises:
a light source, connected to the controller and facing surfaces of the door panels, for projecting a detection light to the door panels under the control of the controller; and
photoresistor receivers, connected to the controller and provided on side surfaces of the door panels facing the second machine, for detecting a light signal;
the light source is provided at a preset position, such that the light projected from the preset position is received by the photoresistor receivers when the connection port is closed.

4. The wafer processing apparatus according to claim 3, wherein there are two photoresistor receivers, two photoresistor receivers are provided on sides of the door panels facing the second machine, and are respectively provided on the two door panels.

5. The wafer processing apparatus according to claim 1, wherein the driver comprises:
a motor drive module, connected to the controller;
a stepping motor, connected to the motor drive module and running under the control of the motor drive module;
a driving gear, connected to the stepping motor, for rotating around a rotation axis of the driving gear under the drive of the stepping motor, the rotation axis is perpendicular to the surfaces of the door panels; and
a gear bar, mounted in cooperation with the driving gear, and moving relative to a mounting position of the driving gear when the driving gear rotates, the door panels are mounted on the gear bar and move under the drive of the gear bar.

6. The wafer processing apparatus according to claim 5, the wafer processing apparatus further comprises:
a sliding rail, a length direction of the sliding rail coincides with a moving path of the door panel; the sliding rail is mounted on the moving path of the door panel; the door panel is mounted on the sliding rail and is capable of sliding along the length direction of the sliding rail; and
a turning wheel, fixedly mounted on the door panel, mounted in a groove of the sliding rail, and is capable of rotating in the groove of the sliding rail along the length direction of the sliding rail;
the sliding rail is provided above the door panel, the gear bar is provided below the door panel, and the driving gear is provided below the gear bar.

7. The wafer processing apparatus according to claim 1, the wafer processing apparatus further comprises an interactive module; the interactive module comprises:
a housing;
a display unit, provided on an outer surface of the housing and connected to the controller, for displaying the open/closed state of the connection port; and
a button, provided in the housing, connected to the controller, and provided for a user to manually control the movement of the door panels so as to control the opening and closing of the connection port.

8. The wafer processing apparatus according to claim 1, the wafer processing apparatus further comprises an alarm, connected to the controller, and comprising at least one of a buzzer and a light-emitting diode (LED) lamp.

9. A wafer transfer method, the wafer transfer method is used for transferring a wafer between the first machine and the second machine of the wafer processing apparatus according to claim 1, the wafer transfer method comprises:
controlling the detector to detect the open-closed state of the connection port when the second machine is ready to transfer the wafer to the first machine through the connection port, and controlling the door panels to move to open the connection port when the connection port is closed.

10. The wafer transfer method according to claim 9, there are two door panels, two door panels are respectively provided on two opposite sides of the connection port; the opening and closing of the connection port is realized by moving the two door panels; when the door panels are controlled to move to open the connection port, the wafer transfer method further comprises:
controlling the detector to detect a distance between the two door panels, and when the distance between the two door panels is within a preset range, controlling the driver to reduce a moving speed of the door panels.

11. The wafer transfer method according to claim 10, wherein the detector comprises:

a light source, connected to the controller and facing surfaces of the door panels, for projecting a detection light to the door panel under the control of the controller; and two photoresistor receivers, connected to the controller, provided on sides of the door panels facing the second machine, and respectively provided on the two door panels, for detecting a light signal;

when the light projected by the light source is received by one or more photoresistor receivers, the detector sends a signal corresponding to the closing of the connection port to the controller.

12. The wafer transfer method according to claim 11, the wafer processing apparatus further comprises:

a safety module, comprising a detection unit and connected to the controller and the manipulator, for detecting, by the detection unit, an open-closed state of the connection port, and controlling the manipulator to stop transferring the wafer to the first machine when the detection unit detects that the connection port is closed;

when the detection unit detects that the connection port is closed, the controller controls the light source to project the detection light to the door panels.

13. The wafer transfer method according to claim 10, the detector further comprises: a metal sheet and an inductive switch sensor, the metal sheet and the inductive switch sensor are respectively provided on surfaces of the same side of the two door panels, when a distance between the metal sheet and the inductive switch sensor changes, an electrical parameter output by the inductive switch sensor changes accordingly; when the detector is controlled to detect the open-closed state of the connection port, the wafer transfer method further comprises:

reducing a driving speed of the driver when the electrical parameter output by the inductive switch sensor is within the preset range.

14. The wafer processing apparatus according to claim 1, wherein when the distance between the metal sheet and the inductive switch sensor is within 10 mm, the electrical parameter output by the inductive switch sensor is within the preset range to control the driver to realize the decelerated movement of the door panels.

15. The wafer processing apparatus according to claim 1, wherein the inductive switch sensor includes an oscillator, a switch circuit and an amplifying output circuit, the oscillator is configured to generate an alternating magnetic field, when the metal sheet approaches the magnetic field and reaches a sensing distance, an eddy current is generated in the metal sheet, which causes the oscillator to attenuate or stop, the amplifying output circuit is configured to process and convert change of the oscillator into a switch signal to trigger the controller, the switch signal is linearly related to the distance between the metal sheet and the inductive switch sensor.

* * * * *